United States Patent
Arakawa et al.

(10) Patent No.: US 9,583,347 B2
(45) Date of Patent: Feb. 28, 2017

(54) MANUFACTURING METHOD FOR SEMICONDUCTOR DEVICE USING RESIST PATTERNS AND IMPURITY INJECTIONS

(71) Applicant: CANON KABUSHIKI KAISHA, Tokyo (JP)

(72) Inventors: Mikio Arakawa, Utsunomiya (JP); Satoshi Yoshizaki, Tachikawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/072,585

(22) Filed: Mar. 17, 2016

(65) Prior Publication Data

US 2016/0284550 A1 Sep. 29, 2016

(30) Foreign Application Priority Data

Mar. 24, 2015 (JP) ................................ 2015-061663

(51) Int. Cl.
| | |
|---|---|
| H01L 21/266 | (2006.01) |
| H01L 27/146 | (2006.01) |
| H01L 21/027 | (2006.01) |
| H01L 21/761 | (2006.01) |

(52) U.S. Cl.
CPC ......... *H01L 21/266* (2013.01); *H01L 21/0274* (2013.01); *H01L 21/761* (2013.01); *H01L 27/1463* (2013.01); *H01L 27/14689* (2013.01)

(58) Field of Classification Search
None
See application file for complete search history.

(56) References Cited

U.S. PATENT DOCUMENTS

| | | | | |
|---|---|---|---|---|
| 5,512,498 A | * | 4/1996 | Okamoto | H01L 21/82389 257/E21.345 |
| 5,593,813 A | * | 1/1997 | Kim | G03F 7/2022 216/2 |
| 7,368,226 B2 | * | 5/2008 | Bae | H01L 21/266 257/E21.257 |
| 2008/0193882 A1 | | 8/2008 | Endo et al. | |
| 2009/0263751 A1 | * | 10/2009 | Sivakumar | G03F 7/38 430/323 |
| 2010/0065938 A1 | * | 3/2010 | Mabuchi | H01L 27/14603 257/443 |
| 2010/0321518 A1 | * | 12/2010 | Shinohara | H01L 27/14621 348/222.1 |
| 2011/0189616 A1 | | 8/2011 | Endo et al. | |
| 2012/0171865 A1 | * | 7/2012 | Yoo | H01L 21/0273 438/694 |

FOREIGN PATENT DOCUMENTS

JP 2011-114063 A 6/2011

* cited by examiner

*Primary Examiner* — Andres Munoz
(74) *Attorney, Agent, or Firm* — Fitzpatrick, Cella, Harper & Scinto

(57) ABSTRACT

A manufacturing method for a semiconductor device, the method, comprising forming, on a substrate, a first resist pattern including a plurality of line patterns extending in a predetermined direction, injecting an impurity into the substrate by using the first resist pattern, removing the first resist pattern, forming a second resist pattern including a plurality of second line patterns extending in the predetermined direction, and injecting an impurity into the substrate by using the second resist pattern, wherein, in the forming the second resist pattern, the plurality of second line patterns are respectively formed between places where the adjacent first line patterns are formed.

17 Claims, 7 Drawing Sheets

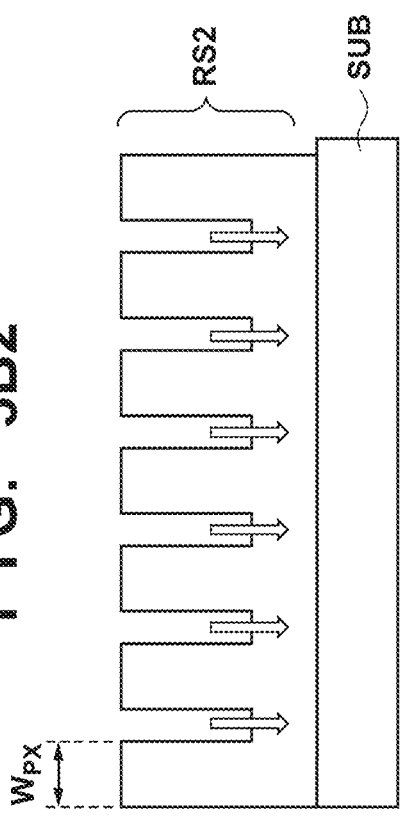
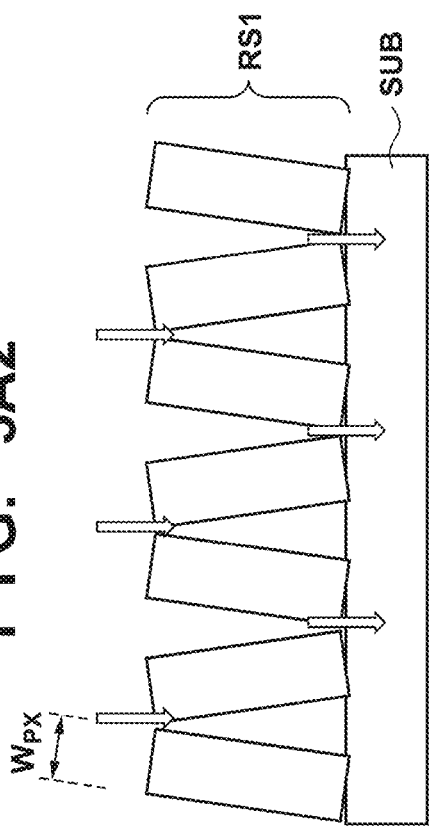
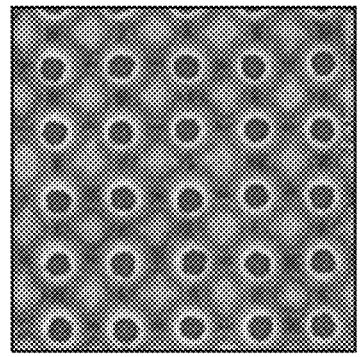
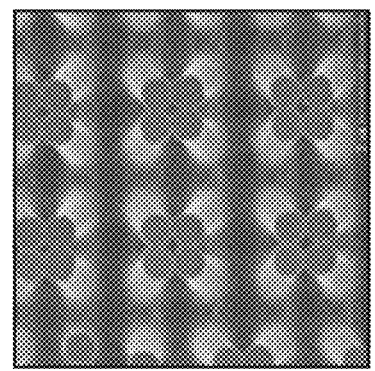

MANUFACTURING METHOD FOR SEMICONDUCTOR DEVICE USING RESIST PATTERNS AND IMPURITY INJECTIONS

BACKGROUND OF THE INVENTION

Field of the Invention

The present invention relates to a manufacturing method for a semiconductor device.

Description of the Related Art

A substrate formed from a semiconductor such as silicon is provided with elements such as transistors and element isolation portions for electrically isolating them from each other. The element isolation portions are formed from, for example, impurity regions. Impurity regions are formed by forming a resist pattern (a resist film or resist member having openings) on a substrate and then injecting an impurity into the substrate by using the resist pattern. A resist pattern is obtained by forming a resist film on a substrate, exposing desired regions of the resist film, and developing the resist film.

Japanese Patent Laid-Open No. 2011-114063 discloses a technique of forming a resist pattern having a grid-like pattern by exposing twice a grid-like region in a planar view with respect to the upper surface of a substrate, and then developing the resist film. More specifically, in the first exposure, a plurality of linear regions, of the resist film, which extend along the first direction in a planar view are exposed. In the second exposure, a plurality of linear regions extending along the second direction intersecting with the first direction are exposed. This method can reduce the influence of diffracted light which can be generated when exposing the grid-like region at once while exposing the grid-like region by the first and second exposures.

A resist pattern needs to have a sufficient height (thickness) to properly function as a mask when injecting an impurity. On the other hand, in order to achieve higher circuit integration or further miniaturization of elements, it is required to decrease the width of each impurity region or the distance between adjacent impurity regions (miniaturization of impurity regions). For the formation of such impurity regions, for example, it is necessary to decrease the width of a resist pattern.

However, such a resist pattern may collapse before or at the time of injection of an impurity. When a resist pattern collapses, an impurity cannot be properly injected into a substrate, and hence desired impurity regions are not formed. This poses a serious problem when attaining a larger number of pixels while suppressing an increase in pixel region in a solid-state imaging device including a plurality of pixels each partitioned by an impurity region. Note that Japanese Patent Laid-Open No. 2011-114063 gives no consideration to the collapse of a resist pattern described above.

SUMMARY OF THE INVENTION

The present invention provides a technique advantageous in miniaturizing impurity regions formed on a substrate.

One of the aspects of the present invention provides a manufacturing method for a semiconductor device, the method comprising forming a first resist film on a substrate, forming a first resist pattern including a plurality of line patterns extending in a predetermined direction in a planar view with respect to an upper surface of the substrate by exposing and developing the first resist film, injecting an impurity into the substrate by using the first resist pattern, removing the first resist pattern followed by forming a second resist film on the substrate, forming a second resist pattern including a plurality of second line patterns extending in the predetermined direction in the planar view by exposing and developing the second resist film, and injecting an impurity into the substrate by using the second resist pattern, wherein in the forming the second resist pattern, the plurality of second line patterns are respectively formed between places where the adjacent first line patterns are formed.

Further features of the present invention will become apparent from the following description of exemplary embodiments with reference to the attached drawings.

BRIEF DESCRIPTION OF THE DRAWINGS

FIGS. 5A1, 5A2, 5B1, and 5B2 are views for explaining resist patterns as reference examples and modes when impurity injection is performed by using the patterns;

DESCRIPTION OF THE EMBODIMENTS

Figure 8:
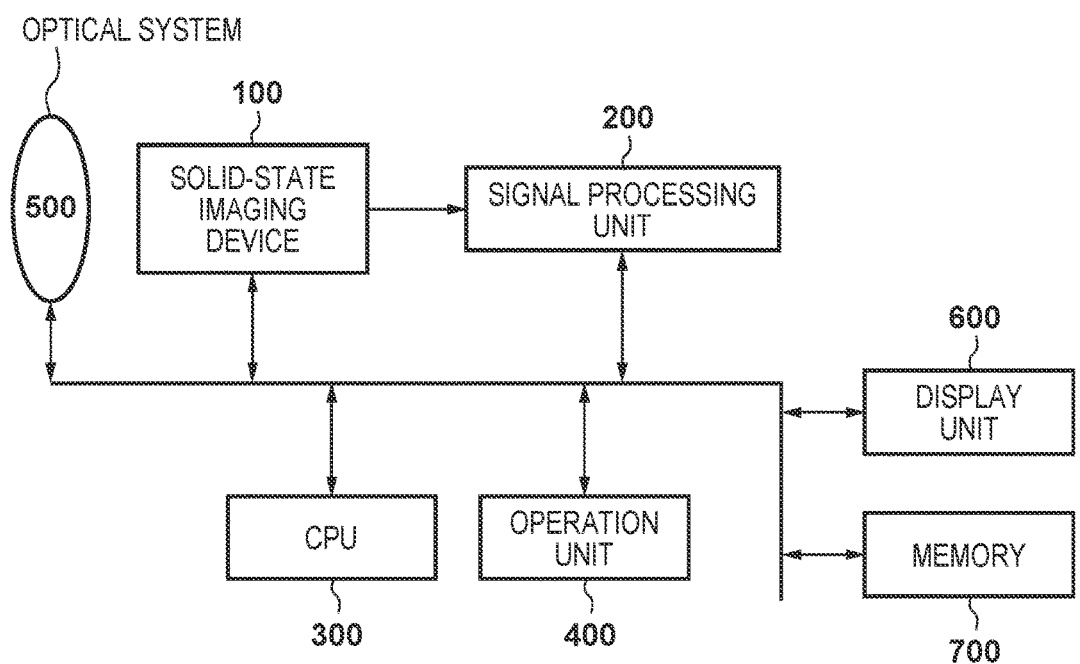
FIG. 8 is a view for explaining an example of the arrangement of a camera.

The present invention will be described below by exemplifying a solid-state imaging device (to be referred to as a "solid-state imaging device 100") typified as an example of a semiconductor device. As exemplarily shown in FIG. 8, the solid-state imaging device 100 can be applied to, for example, a camera. The camera includes, for example, a processing unit 200, a CPU 300 (or processor), an operation unit 400, and an optical system 500 for forming an object image on an imaging unit, in addition to the solid-state imaging device 100. The camera can also include a display unit 600 for displaying still images and moving images and a memory 700 for storing the data of them. The solid-state imaging device 100 obtains image data based on incident light from the optical system 500. The processing unit 200 performs predetermined correction processing for the image data, and outputs the resultant data to the display unit 600 and the memory 700. The CPU 300 can change setting information in each unit and a control method for each unit in accordance with imaging conditions input by the user via the operation unit 400. The concept of the camera includes not only a device mainly aiming at image capturing but also a device (for example, a personal computer or portable terminal) accessorily having an image capturing function.

The solid-state imaging device 100 includes a pixel array ("pixel array $A_{PX}$") having a plurality of pixels arrayed on a substrate (to be referred to as a "substrate SUB") formed from, for example, a semiconductor such as silicon.

Figure 1:
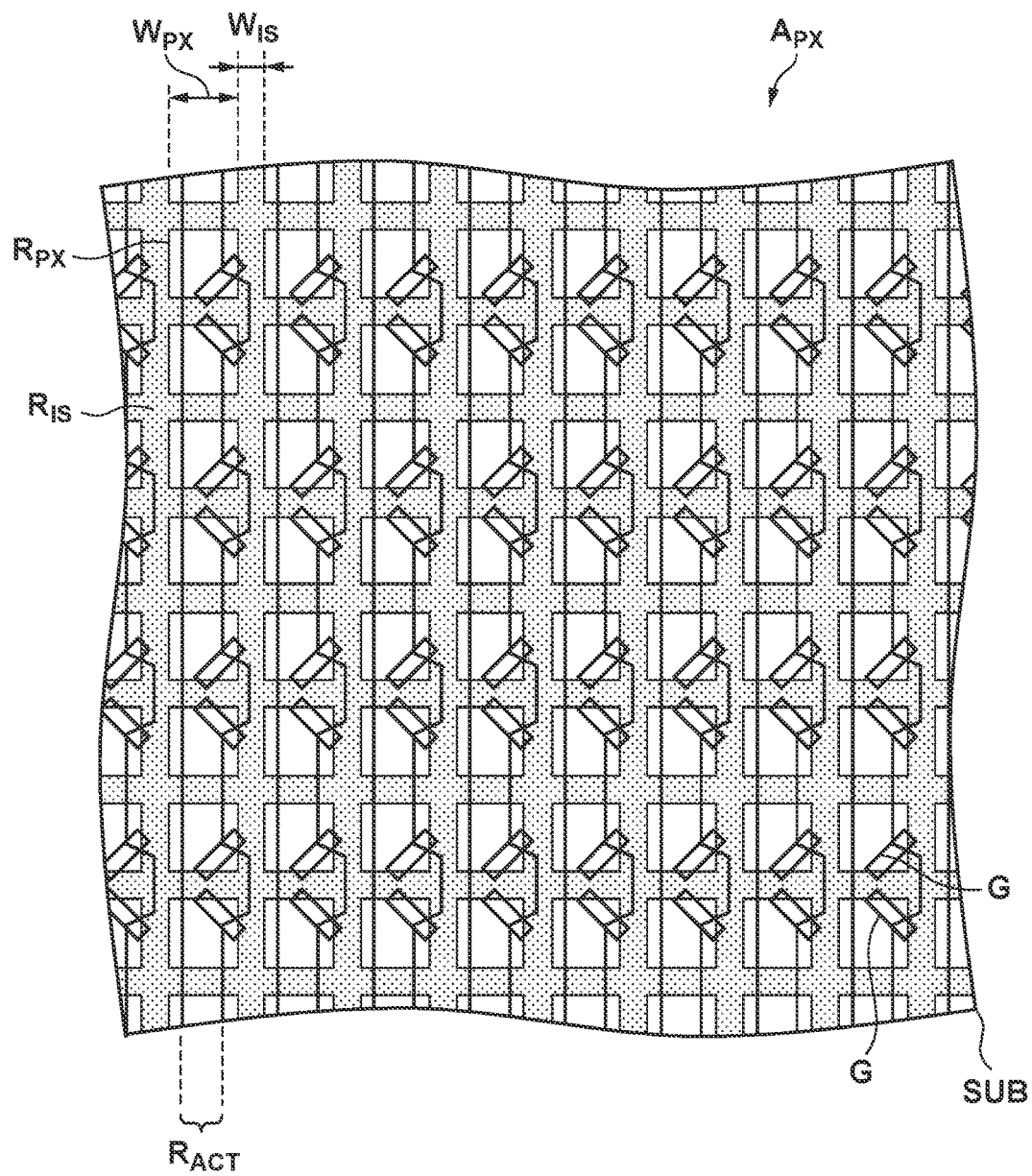
FIG. 1 is a view for explaining the layout of a partial region of a pixel array.

FIG. 1 is a schematic view for explaining the layout of the pixel array $A_{PX}$. FIG. 1 shows a partial region (to be referred to as a "region K") of the pixel array $A_{PX}$. For the sake of visualization, FIG. 1 mainly shows regions $R_{PX}$ in which elements constituting the respective pixels are arranged, impurity regions $R_{IS}$ as element isolation portions partitioning the respective pixels, active regions $R_{ACT}$, and gate electrodes G of transistors. Referring to FIG. 1, $W_{PX}$ represents the width of each region $R_{PX}$, and $W_{IS}$ represents the width of each impurity region $R_{IS}$ (the width of each element isolation portion).

Each pixel can include, for example, a photoelectric conversion unit and a transfer transistor for reading out charges generated by the photoelectric conversion unit. Each gate electrode G in FIG. 1 is the gate electrode of the transfer transistor. Although not shown in FIG. 1, each pixel may further include a reset transistor for initializing the photoelectric conversion unit and an amplifying transistor for amplifying a signal corresponding to charges transferred by the transfer transistor.

Figure 2A:
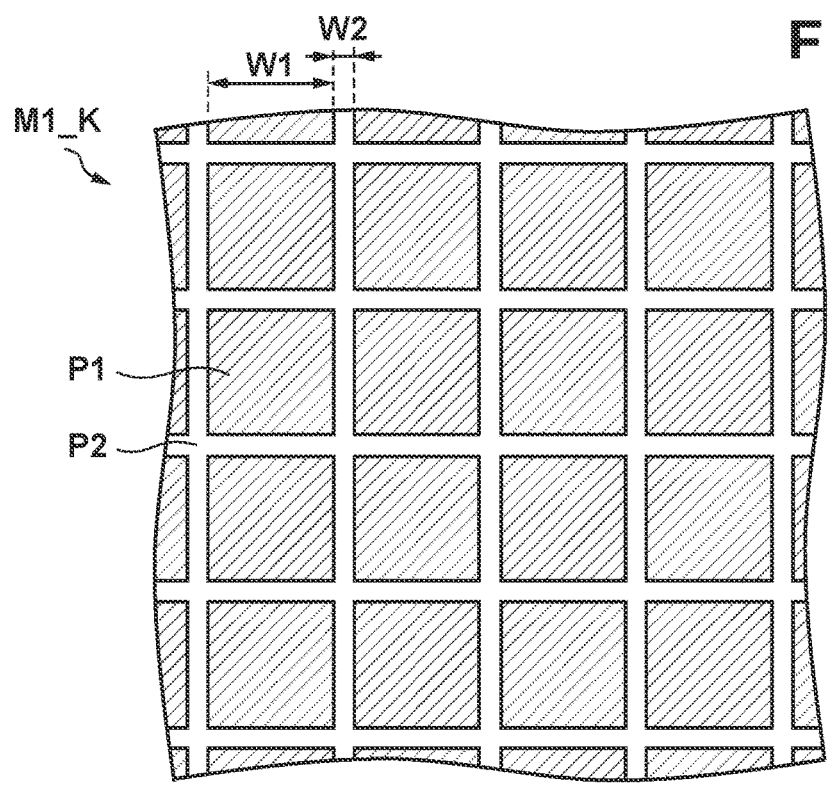
FIGS. 2A and 2B are views for explaining a mask pattern used in a manufacturing method according to the present invention.
Figure 2B:
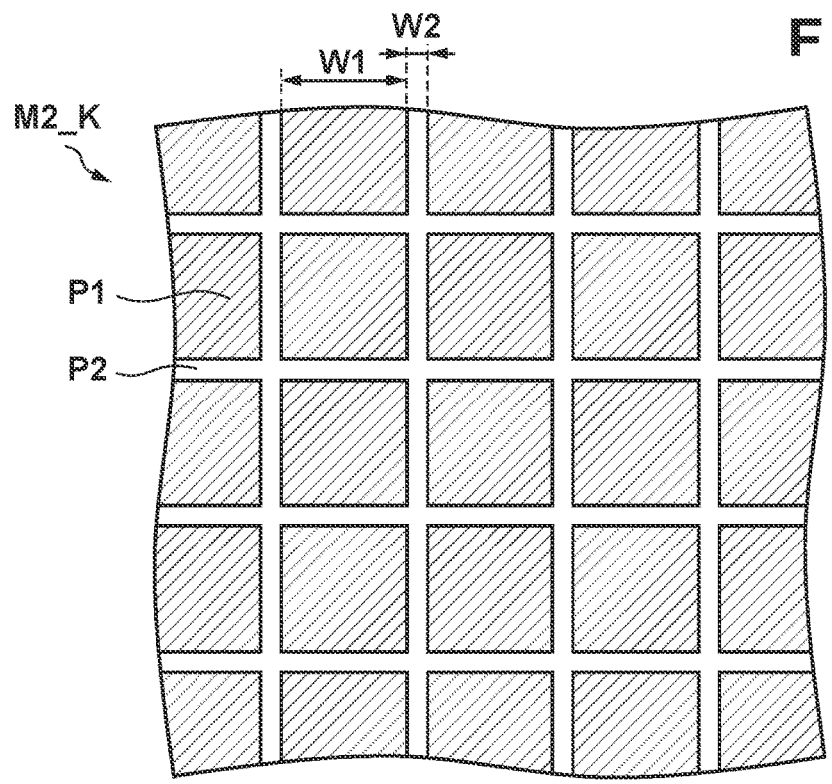

FIGS. 2A and 2B are views for explaining mask patterns (reticles) used to form the impurity regions $R_{IS}$. Although described in detail later, the impurity regions $R_{IS}$ are formed by performing exposure twice using an exposure apparatus and performing a developing process and impurity injection after each exposure. FIG. 2A shows a portion of a mask pattern M1_K used for the first exposure, which corresponds to the region K of the pixel array $A_{PX}$ shown in FIG. 1. Note that when using, for example, a positive resist film, hatched portions P1 of the mask pattern M1_K shield against exposure light, and portions P2 without hatching pass exposure light.

Likewise, FIG. 2B shows a portion, of a mask pattern M2_K used for the second exposure, which corresponds to the region K.

In a planar view (a planar view with respect to the upper surface of the substrate SUB), the mask pattern M1_K and the mask pattern M2_K each have a grid-like pattern. More specifically, the portions P2 are arranged in a reticular pattern. A width W2 of each portion P2 corresponds to the width $W_{IS}$ of each impurity region $R_{IS}$. More specifically, a value obtained by multiplying the width W2 by the projection magnification of the exposure apparatus corresponds to the width $W_{IS}$. A width W1 of each portion P1 corresponds to a width $(2\times W_{PX}+W_{IS})$. More specifically, a value obtained by multiplying the width W1 by the projection magnification of the exposure apparatus corresponds to the width $(2\times W_{PX}+W_{IS})$. One of each pattern element of the mask pattern M1_K and each pattern element of the mask pattern M2_K is shifted from the other by a distance corresponding to the width $W_{PX}$ in each of the row and column directions.

The impurity regions $R_{IS}$ are formed by using the mask pattern M1_K and the mask pattern M2_K. More specifically, the impurity regions $R_{IS}$ are formed by performing the following steps:

S1: coat the upper surface of the substrate SUB with a positive first resist film;
S2: expose the first resist film by using the mask pattern M1_K (the first exposure);
S3: form the first resist pattern by a developing process;
S4: inject an impurity into the substrate SUB by using the first resist pattern;
S5: coat the upper surface of the substrate SUB with the second resist film upon removal of the first resist pattern;
S6: expose the second resist film by using the mask pattern M2_K (the second exposure);
S7: form the second resist pattern by a developing process; and
S8: inject an impurity into the substrate SUB by using the second resist pattern.

The first resist film applied in step S1 and the first resist pattern formed by the exposure process and the developing process in steps S2 and S3 preferably have thicknesses equal to or more than 5 μm. In addition, in step S4, an impurity can be injected with an intensity in the range of, for example, 300 keV to 1,500 keV. Likewise, the second resist film (see step S5) and the second resist pattern (see steps S6 and S7) preferably have thicknesses equal to or more than 5 μm, and an impurity is preferably injected (see step S8) with an intensity in the range of 300 keV to 1,500 keV. In this case, for example, the width $W_{PX}$ is about or equal to or less than 0.8 μm, and the width $W_{IS}$ is about or equal to or less than 0.4 μm.

Figure 3A:
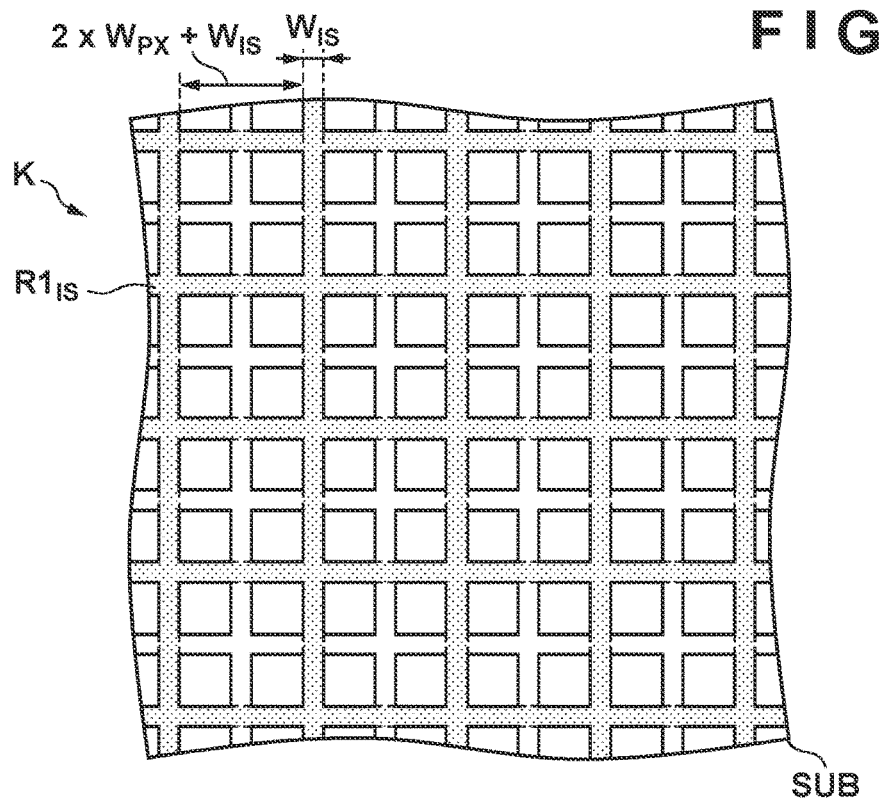
FIGS. 3A and 3B are views for explaining impurity regions formed by the manufacturing method according to the present invention.
Figure 3B:
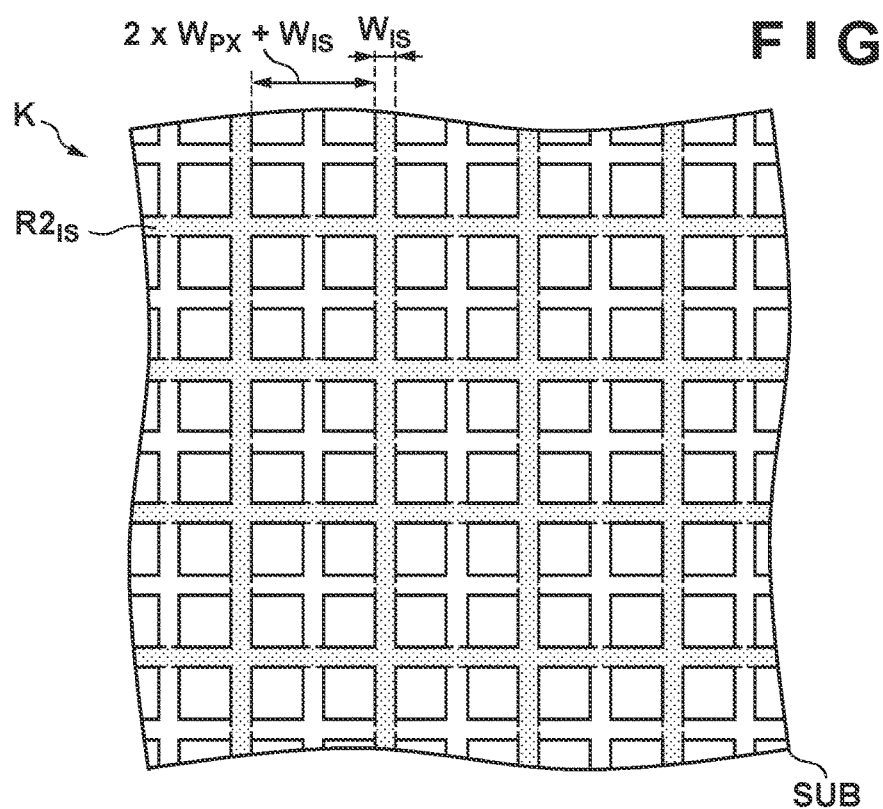

FIGS. 3A and 3B are views for explaining the first portions (to be referred to as "regions $R1_{IS}$" in FIG. 3A) and the second portions (to be referred to as "regions $R2_{IS}$" in FIG. 3B), of the impurity regions $R_{IS}$, which are respectively formed in steps S1 to S4 and steps S5 to S8.

In a planar view, the regions $R1_{IS}$ as the first portions are formed in a reticular pattern so as to partition every four regions $R_{PX}$ of 2 rows×2 columns (that is, every four pixels of 2 rows×2 columns). On the other hand, although the regions $R2_{IS}$ as the second portions are formed in a reticular pattern so as to partition every four regions $R_{PX}$ of 2 rows×2 columns, the position of each region $R2_{IS}$ is shifted from the corresponding region $R1_{IS}$ by a distance almost equal to a width $(W_{PX}+W_{IS})$ in each of the row and column directions. In other words, the place in which the grid-like pattern of the second resist pattern is formed is shifted from that in which the grid-like pattern of the first resist pattern is formed by a distance corresponding to the pitch between the pixels in each of the row and column directions. As a result, the impurity regions $R_{IS}$ are formed in a reticular pattern with a uniform pitch so as to partition each region $R_{PX}$.

Figure 4:
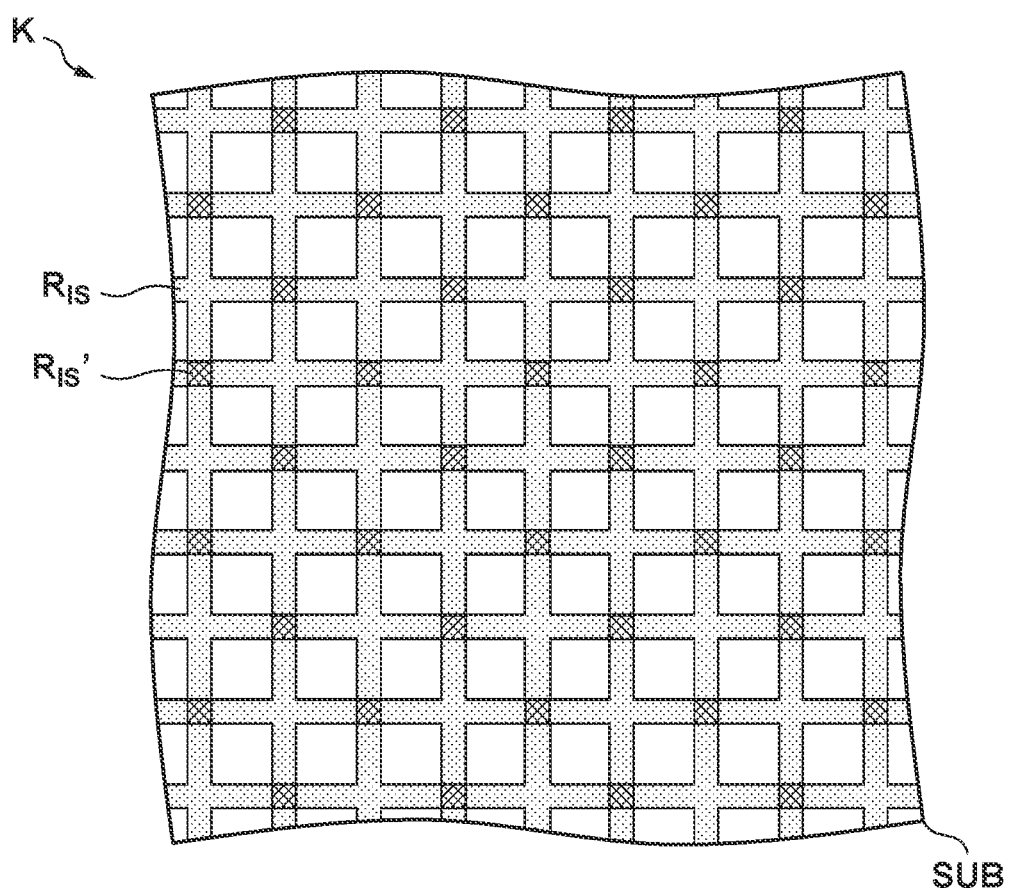
FIG. 4 is a view for explaining a region into which an impurity is redundantly injected.

Note that according to the above method, as shown in FIG. 4, there are regions $R_{IS}'$ where the regions $R1_{IS}$ and the regions $R2_{IS}$ overlap (that is, the regions $R_{IS}'$ in which an impurity is injected twice). In order to inhibit the formation of the regions $R_{IS}'$, for example, the mask pattern M1_K used for the first exposure described above may be designed so as not to expose portions, of the first resist film, which correspond to the regions $R_{IS}'$. Alternatively, the mask pattern M2_K used for the second exposure described above may be designed so as not to expose portions, of the second resist film, which correspond to the regions $R_{IS}'$.

For reference, an example of forming the above impurity regions $R_{IS}$ at once (by performing a series of processes including exposure, developing, and impurity injection once) will be described below with reference to FIGS. 5A1, 5A2, 5B1, and 5B2.

FIG. 5A1 shows an SEM photo of a resist pattern (to be referred to as a "resist pattern RS1") for forming the impurity regions $R_{IS}$ at once as the first reference example. FIG. 5A2 is a schematic view showing a cross-sectional structure along a cut line X1-X2. As shown in FIG. 5A2, the width of each portion of the resist pattern RS1 which functions as a mask is the width $W_{PX}$. In this case, each portion has a very small width relative to the height, and has collapsed. Note that the arrows shown in FIG. 5A2 indicate an injected impurity. Part of the impurity has not reached the substrate because of the collapsed portions of the resist pattern RS1.

FIG. 5B1 shows an SEM photo of a resist pattern (to be referred to as a "resist pattern RS2") for forming the impurity regions $R_{IS}$ at once as the second reference example. FIG. 5B2 is a schematic view showing a cross-sectional structure along a cut line Y1-Y2. In the second reference example, the amount of exposure light is adjusted (the amount of exposure light is set to be smaller than in the first reference example) to prevent the collapse of each portion of the resist pattern RS2 which functions as a mask. As shown in FIG. 5B2, however, with this process, the residue of the resist film remains in regions irradiated with exposure light, and part of the injected impurity has not reached the substrate because of the residue.

In contrast to this, according to the manufacturing method for the solid-state imaging device 100 following steps S1 to S8 described above, the regions $R1_{IS}$ are formed first as the first portions of the impurity regions $R_{IS}$, and the regions $R2_{IS}$ are then formed as the second portions of the impurity regions $R_{IS}$. The pitches of the regions $R1_{IS}$ and the regions $R2_{IS}$ are both larger than the pitch of the impurity regions $R_{IS}$ to be finally formed. This allows the first resist pattern (see step S3) and the second resist pattern (see step S7) used for the formation of the regions $R1_{IS}$ and the regions $R2_{IS}$ to have larger widths than those in the reference examples shown in FIGS. 5A1, 5A2, 5B1, and 5B2.

Figure 6A:
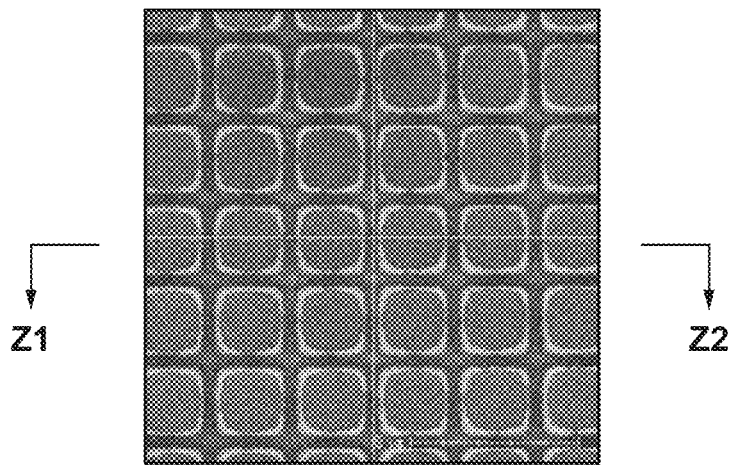
FIGS. 6A and 6B are views for explaining a resist pattern according to the present invention and a mode when impurity injection is performed by using the pattern.
Figure 6B:
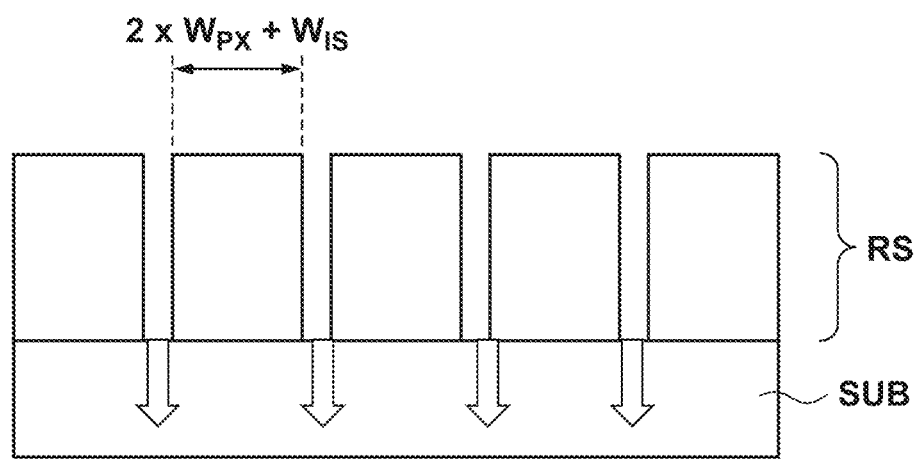

FIG. 6A is an SEM photo of the first resist pattern (to be referred to as a "first resist pattern RS") formed by this manufacturing method. FIG. 6B is a schematic view showing a cross-sectional structure along a cut line Z1-Z2. According to this manufacturing method, each portion of the first resist pattern RS which functions as a mask has a width $(2 \times W_{PX} + W_{IS})$, which is larger than that in the reference examples shown in FIGS. 5A1, 5A2, 5B1, and 5B2, and hence is hard to collapse. The same applies to the second resist pattern.

According this manufacturing method, therefore, the first and second resist patterns are hard to collapse before and at the time of impurity injection, and hence can properly form the fine impurity regions $R_{IS}$.

In addition, according to this manufacturing method, to perform two exposures, the two mask patterns M1_K and M2_K corresponding to them are prepared. However, since these mask patterns are identical, it is possible to form the impurity regions $R_{IS}$ by using one mask pattern.

More specifically, for example, first of all, a reticle having the mask pattern M1_K is set on the reticle stage of the exposure apparatus, and the substrate SUB coated with the first resist film is set on the wafer stage of the exposure apparatus. The first exposure is then performed. Thereafter, the substrate SUB is unloaded from the exposure apparatus, and a developing process and impurity injection are performed. This forms the regions $R1_{IS}$ as the first portions of the impurity regions $R_{IS}$ on the substrate SUB.

The substrate SUB on which the regions $R1_{IS}$ are formed is then set on the wafer stage, and the position of the reticle stage, on which the reticle having the mask pattern M1_K is set, relative to the substrate SUB is moved. The second exposure is then performed. The moving amount and moving direction of the reticle stage are preferably set to shift the mask pattern M1_K to a position corresponding to the mask pattern M2_K which is not used in this case. Thereafter, the substrate SUB is unloaded from the exposure apparatus, and a developing process and impurity injection are performed. This forms the regions $R2_{IS}$ as the second portions of the impurity regions $R_{IS}$ on the substrate SUB. As a result, the impurity regions $R_{IS}$ are formed.

Figure 7:
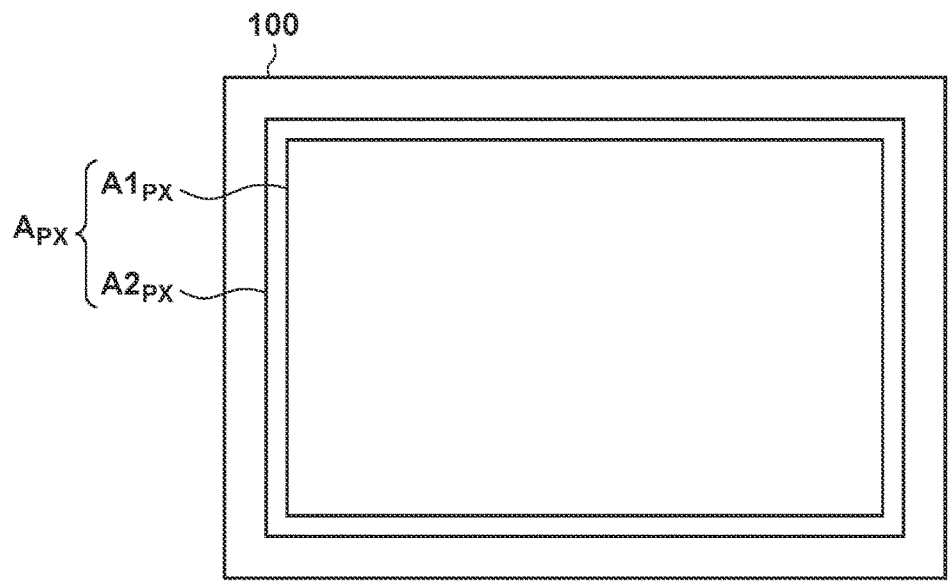
FIG. 7 is a view for explaining an example of the arrangement of a pixel array.

According to this method, an exposure region on the substrate SUB shifts in accordance with the moving amount and moving direction of the reticle stage. For this reason, the pixel array $A_{PX}$ preferably includes not only an effective pixel region $A1_{PX}$ in which pixels for image capturing are arrayed but also a dummy region $A2_{PX}$ as a region surrounding the effective pixel region $A1_{PX}$, as exemplarily shown in FIG. 7. Each pixel located in the dummy region $A2_{PX}$ is also called a dummy pixel, which may not be substantially used for the formation of image signals.

The present invention is not limited to the above modes, and may be partly changed as needed within the spirit and scope of the invention. For example, the above description has exemplified the case in which a positive resist film is used. However, the same applies to a case in which a negative resist film is used. In addition, the above description has exemplified the case in which a series of processes including exposure, developing, and impurity injection are performed twice to form the impurity regions $R_{IS}$. However, the impurity regions $R_{IS}$ may be formed by performing the series of processes three or more times.

In addition, the shape of the impurity regions $R_{IS}$ may not be a grid-like shape in a planar view, and may be a stripe shape (each region may include a plurality of linear portions). In this case, the mask patterns M1_K and M2_K and the first and second resist patterns formed by using them each have a plurality of line patterns extending in the row or column direction. According to this case, it is possible to prevent the respective line patterns of the first and second resist patterns from collapsing in the extending direction and intersecting direction.

In addition, each case described above has exemplified the mode applied to the formation of the impurity regions $R_{IS}$ which partition the respective pixels of the solid-state imaging device 100. Obviously, however, the present invention is not limited to this mode, and may be applied to other manufacturing methods for semiconductor devices within the spirit and scope of the invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-061663, filed Mar. 24, 2015, which is hereby incorporated by reference herein in its entirety.

What is claimed is:
1. A manufacturing method for a semiconductor device, the method comprising:
    forming a first resist pattern on a substrate, the first resist pattern including, in a planar view with respect to an upper surface of the substrate, a plurality of first line patterns each extending continuously along a first direction and a plurality of third line patterns each extending continuously along a second direction intersecting the first direction, such that each first line pattern contacts the plurality of the third line patterns and that each third line pattern contacts the plurality of the first line patterns;
    injecting a first impurity into the substrate by using the first resist pattern;
    removing the first resist pattern;
    forming a second resist pattern on the substrate, the second resist pattern including, in the planar view, a plurality of second line patterns each extending continuously along the first direction and a plurality of fourth line patterns each extending continuously along the second direction, such that each second line pattern contacts the plurality of the fourth line patterns and that each fourth line pattern contacts the plurality of the second line patterns; and injecting a second impurity into the substrate by using the second resist pattern, wherein, in the forming of the second resist pattern, the plurality of the second line patterns are respectively formed between two adjacent patterns of the plurality of the first line patterns, and the plurality of the fourth line patterns are respectively formed between two adjacent patterns of the plurality of the third line patterns.

2. The method according to claim 1, wherein in the planar view, in the forming of the first resist pattern, the plurality of the first line patterns are formed at predetermined intervals, and in the forming of the second resist pattern, the plurality of the second line patterns are formed such that distances between places where the plurality of the first line patterns are formed and respective second line patterns adjacent to the places become uniform.

3. The method according to claim 1, wherein in the planar view, in the forming of the first resist pattern, the plurality of the third line patterns are formed at predetermined intervals, and in the forming of the second resist pattern, the plurality of the fourth line patterns are formed such that distances between places where the plurality of the third line patterns are formed and respective fourth line patterns adjacent to the places become uniform.

4. The method according to claim 1, wherein the semiconductor device comprises a solid-state imaging device including a plurality of pixels arrayed on the substrate, wherein the plurality of the first line patterns and the plurality of the second line patterns are formed to partition the plurality of the pixels along one of a column direction and a row direction, and wherein the plurality of the third line patterns and the plurality of the fourth line patterns are formed to partition the plurality of the pixels along the other of the column direction and the row direction.

5. The method according to claim 4, wherein each pixel located in a peripheral region of a region in which the plurality of the pixels are arrayed comprises a dummy pixel.

6. The method according to claim 1, wherein the first impurity and/or the second impurity injected into the substrate form element isolation portions.

7. The method according to claim 1, wherein an exposure in the forming of the first resist pattern and an exposure in the forming of the second resist pattern use the same reticle.

8. The method according to claim 7, wherein in the forming of the second resist pattern after setting and exposing the reticle on a reticle stage of an exposure apparatus in the forming of the first resist pattern, a position of the reticle stage, on which the reticle is set, relative to the substrate is moved and exposure is performed so as to form the plurality of the second line patterns between places where the plurality of the first line patterns adjacent to each other in the planar view are formed.

9. The method according to claim 1, wherein in the injecting of the first impurity into the substrate by using the first resist pattern and in the injecting of the second impurity into the substrate by using the second resist pattern, the first impurity and the second impurity are injected with an intensity of 300 keV to 1,500 keV.

10. The method according to claim 1, wherein the second resist pattern is a pattern obtained by shifting the first resist pattern by a first distance in the first direction.

11. The method according to claim 1, wherein the second resist pattern is a pattern obtained by shifting the first resist pattern by a second distance in the second direction.

12. The method according to claim 1, wherein a width of each first line pattern in the second direction is equal to that of each second line pattern.

13. The method according to claim 1, wherein a width of each third line pattern in the first direction is equal to that of each fourth line pattern.

14. The method according to claim 1, wherein the first resist pattern has a single grid-shaped pattern, and wherein the second resist pattern has another single grid-shaped pattern.

15. The method according to claim 14, wherein, after the injecting the second impurity into the substrate, a grid-shaped pattern obtained by overlapping the first and the second resist patterns is formed on the substrate, the grid-shaped pattern including the first impurity and/or the second impurity, and wherein portions of the grid-shaped pattern, which include both of the first impurity and the second impurity, correspond to areas where each first line pattern and each fourth line pattern overlap or where each second line pattern and each third line pattern overlap.

16. The method according to claim 15, wherein the semiconductor device comprises a solid-state imaging device including a plurality of pixels arrayed on the substrate, wherein the plurality of the first line patterns and the plurality of the second line patterns are formed to partition the plurality of the pixels along one of a column direction and a row direction, wherein the plurality of the third line patterns and the plurality of the fourth line patterns are formed to partition the plurality of the pixels along the other of the column direction and the row direction, and wherein, after the injecting of the second impurity into the substrate, each of the portions of the grid-shaped pattern obtained by the overlapping of the first and the second resist patterns is formed so as to be positioned between two pixels neighboring in a diagonal direction in the planar view.

17. The method according to claim 16, wherein, after the injecting of the second impurity into the substrate, the portions of the grid-shaped pattern obtained by the overlapping of the first and the second resist patterns are staggered-arranged along the first direction or the second direction in the planar view.

* * * * *